(12) United States Patent
Hunter

(10) Patent No.: US 6,441,560 B1
(45) Date of Patent: Aug. 27, 2002

(54) ACTIVE MATRIX ELECTROLUMINESCENT DISPLAY DEVICE

(75) Inventor: Iain M. Hunter, Brighton (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/642,257

(22) Filed: Aug. 18, 2000

(30) Foreign Application Priority Data

Aug. 19, 1999 (GB) ............................................. 9919536

(51) Int. Cl.[7] ................................................ G09G 3/10
(52) U.S. Cl. ................................ 315/169.1; 315/169.3; 313/505; 345/76
(58) Field of Search .......................... 315/169.1, 169.3, 315/169.4, 169.2; 313/505, 506, 509, 512; 345/76, 77, 56

(56) References Cited

U.S. PATENT DOCUMENTS

| | | | | |
|---|---|---|---|---|
| 4,975,691 A | * | 12/1990 | Lee | ........................ 315/169.3 |
| 5,973,456 A | * | 10/1999 | Osada et al. | ............. 315/169.1 |
| 6,057,647 A | * | 5/2000 | Kurosawa et al. | ....... 315/169.1 |
| 6,191,764 B1 | * | 2/2001 | Kono et al. | .................... 345/76 |

FOREIGN PATENT DOCUMENTS

| | | | |
|---|---|---|---|
| EP | 0653741 A1 | 5/1995 | ............ G09G/3/30 |
| EP | 0717446 A2 | 6/1996 | ........... H01L/27/15 |
| EP | 0923067 A1 | 6/1999 | ............ G09G/3/30 |
| WO | WO9636959 | 11/1996 | ............ G09G/3/30 |
| WO | WO9965012 | 12/1999 | ............ G09G/3/30 |

* cited by examiner

Primary Examiner—Don Wong
Assistant Examiner—Jimmy T. Vu

(57) ABSTRACT

An active matrix electroluminescent display device comprises an array of display pixels (10) which each include a current-driven electroluminescent display element (20) connected to a driving device (22) controlling the current flowing through the display element in a drive period according to a voltage stored on a capacitance (36) and determined by a data signal applied in a preceding address period. In order to compensate for ageing effects in the display element, electro-optic devices (45, 40) are included in the pixel for adjusting the voltage stored on the capacitance in dependence on the light output of its display element during the address period.

20 Claims, 3 Drawing Sheets

ACTIVE MATRIX ELECTROLUMINESCENT DISPLAY DEVICE

BACKGROUND OF THE INVENTION

This invention relates to active matrix electroluminescent display devices comprising an array of electroluminescent display pixels. More particularly, the invention concerns an active matrix electroluminescent display device comprising an array of display pixels with each pixel comprising an electroluminescent display element and a driving device for controlling the current through the display element based on a drive signal applied to the pixel during an address period and stored as a voltage on a storage capacitance connected to the pixel driving device.

Matrix display devices employing electroluminescent, light-emitting, display elements are well known. The display elements may comprise organic thin film electroluminescent elements, for example using polymer materials, or else light emitting diodes (LEDs) using traditional III–V semiconductor compounds. Recent developments in organic electroluminescent materials, particularly polymer materials, have demonstrated their ability to be used practically for video display devices. These materials typically comprise one or more layers of an electroluminescent material, for example a semiconducting conjugated polymer, sandwiched between a pair of electrodes, one of which is transparent and the other of which is of a material suitable for injecting holes or electrons into the polymer layer. The polymer material can be fabricated using a CVD process, or simply by printing or a spin coating technique using a solution of a soluble conjugated polymer.

Organic electroluminescent materials exhibit diode-like I–V properties, so that they are capable of providing both a display function and a switching function, and can therefore be used in passive type displays.

However, the invention is concerned with active matrix display devices, with each pixel comprising a display element and a switching device for controlling the current through the display elements. Examples of an active matrix electroluminescent display are described in EP-A-0653741 and EP-A-0717446. Unlike active matrix liquid crystal display devices in which the display elements are capacitive and therefore take virtually no current and allow a drive signal voltage to be stored on the capacitance for the whole field period, the electroluminescent display elements need to continuously pass current to generate light. A driving device of a pixel, usually comprising a TFT (thin film transistor), is responsible for controlling the current through the display element. The brightness of the display element is proportional to the current flowing through it. During an address period for a pixel, a drive (data) signal in the form of a voltage or current signal determining the required output from the display element is applied to the pixel and stored as a corresponding voltage level on a storage capacitance which is connected to, and controls the operation of, the current controlling drive device with the voltage stored on the capacitance serving to maintain operation of the switching device in supplying current through the display element during the period, corresponding to a field period, until the pixel is addressed again.

A problem with known organic electroluminescent materials, particularly polymer materials, is that they suffer ageing effects whereby the light output for a given drive current is reduced over a period of time of operation. While in certain applications such ageing effects may not be critical, the consequences in a pixellated display can be serious as any slight variations in light output from pixels can easily be perceived by a viewer.

SUMMARY OF THE INVENTION

It is an object of the present invention to provide an active matrix electroluminescent display device in which this problem is overcome at least to an extent.

According to the present invention there is provided an active matrix electroluminescent display device comprising an array of display pixels each comprising an electroluminescent display element and a driving device for controlling the current through the display element based on a drive signal applied to the pixel during an address period and stored as a voltage on a storage capacitance connected to the driving device, which is characterized in that each pixel includes electro-optic adjustment means which is responsive to light produced by the display element during addressing and arranged to adjust in the address period the voltage signal stored on the capacitance in accordance with the light output level of the display element.

Thus, by means of the electro-optic adjustment means, the stored signal voltage for determining the light output level of the display element in the drive (display) period following addressing is adjusted according to the light output characteristic of the display element, providing a feedback variable, whereby the drive level set on the pixel can compensate for the effects of ageing of the display elements so that a desired light output level from a display element for a given applied drive signal is substantially maintained regardless of possible variations in the drive current level/light output level characteristics of individual display elements in the array.

In the case where the drive device of a pixel comprises a TFT (thin film transistor) as is usual in active matrix electroluminescent display devices, the invention offers a further important advantage. The drive current for a display element is determined by the voltage applied to the gate of the TFT, corresponding to the voltage stored in the capacitance. This drive current therefore depends strongly on the characteristics of the TFT and variations in the threshold voltage, mobility and dimensions of the individual TFTs of pixels of the array, for example, due to manufacturing processes, can produce unwanted variations in the display element currents and hence in the light levels produced, leading to non-uniformity in the display output. The effect of the electro-optic adjustment means in controlling the stored voltage signal will also compensate for such variations in TFT characteristics.

Although the invention is particularly beneficial in devices using polymer LED materials, it can of course be applied to advantage in any electroluminescent device in which the electroluminescent material similarly suffers ageing effects resulting in lower light output levels for a given drive current over a period of time of operation.

Preferably the electro-optic means regulates a current flowing in the pixel during the address period according to an applied data signal upon which current the voltage stored on the capacitance following the address period is dependent.

In a preferred embodiment, the electro-optic means comprises a photoelectric device connected to the storage capacitance via a switch device, for example, another TFT, which is arranged to be closed during the address period so as to connect the photoelectric device in parallel with the storage capacitance during the address period. During the driving period, the photoelectric device is effectively disconnected from the storage capacitance and plays no part in the operation of the pixel. In the address period, and with the data signal comprising a current signal, the photoelectric device serves to shunt current from the capacitance in dependence upon the display element's light output until an equilibrium state is reached and the capacitance voltage, and thus the gate voltage of the drive TFT, stabilizes.

The photoelectric device preferably comprises a photodiode, although a photoresistor or phototransistor could alternatively be employed.

BRIEF DESCRIPTION OF THE DRAWING

An embodiment of an active matrix electroluminescent display device in accordance with the present invention will now be described, by way of example, with reference to the accompanying drawings, in which.

The Figures are merely schematic. The same reference numbers are used throughout the Figures to denote the same or similar parts.

DESCRIPTION OF THE PREFERRED EMBODIMENTS

Figure 1:
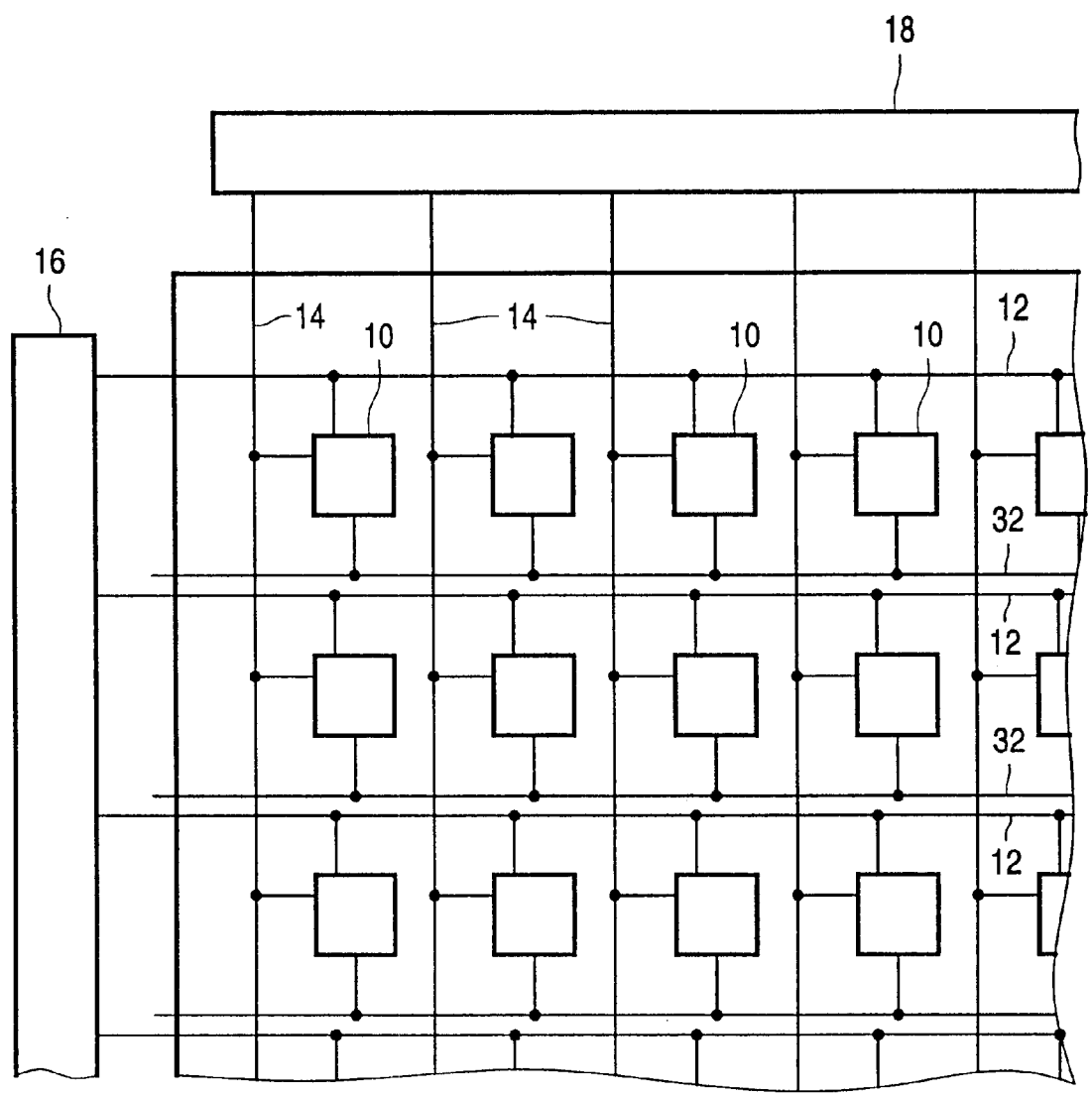
FIG. 1 is a simplified schematic diagram of a known active matrix electroluminescent display device comprising an array of pixels.

Referring to FIG. 1, the active matrix electroluminescent display device comprises a panel having a row and column matrix array of regularly-spaced pixels, denoted by the blocks 10, each comprising an electroluminescent display element and an associated driving device controlling the current through the display element, and which are located at the intersections between crossing sets of row (selection) and column (data) address conductors, or lines, 12 and 14. Only a few pixels are shown here for simplicity. The pixels 10 are addressed via the sets of address conductors by a peripheral drive circuit comprising a row, scanning, driver circuit 16 and a column, data, driver circuit 18 connected to the ends of the respective sets.

Each row of pixels is addressed in turn by means of a selection signal applied by the circuit 16 to the relevant row conductor 12 so as to load the pixels of the row with respective drive signals, determining their individual display outputs, according to the respective data signals supplied in parallel by the circuit 18 to the column conductors. As each row is addressed, the appropriate data signals are supplied by the circuit 18 in appropriate synchronisation.

Figure 2:
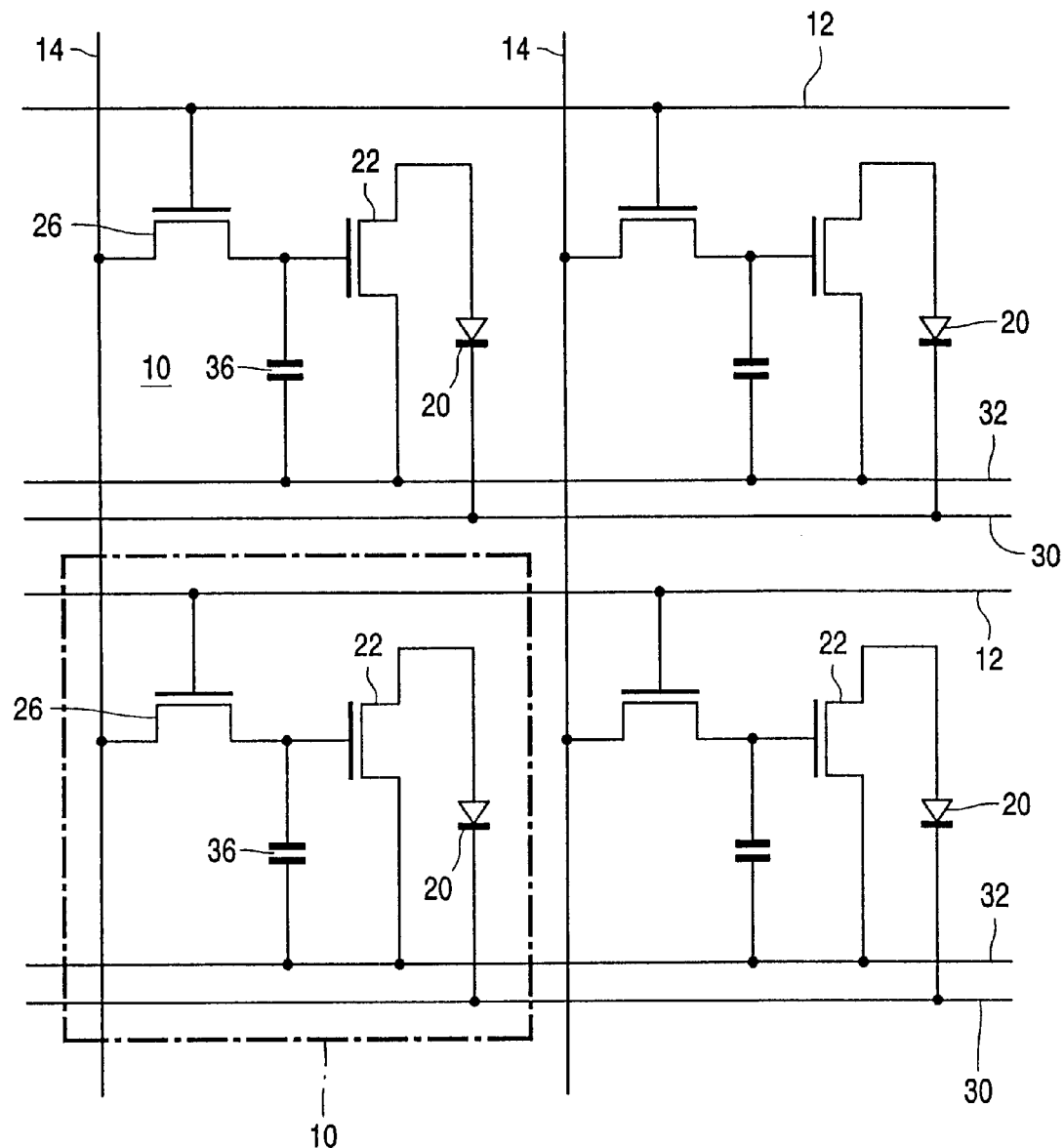
FIG. 2 shows the equivalent circuit of a few typical pixels of the known active matrix electoluminescent display device of FIG. 1.

FIG. 2 illustrates the circuit of a few, typical, pixels in this known device. In this particular device, the data signals comprise voltage signals. Each pixel, 10, includes a light emitting organic electroluminescent display element 20, represented here as a diode element (LED), and comprising a pair of electrodes between which one or more active layers of organic electroluminescent material is sandwiched. In this particular embodiment the material comprises a polymer LED material, although other organic electroluminescent materials, such as low molecular weight materials, could be used. The display elements of the array are carried together with the associated active matrix circuitry on one side of an insulating support. Either the cathodes or the anodes of the display elements are formed of transparent conductive material. The support is of transparent material such as glass and the electrodes of the individual display elements 20 closest to the substrate can consist of a transparent conductive material such as ITO so that light generated by the electroluminescent layer is transmitted through these electrodes and the support so as to be visible to a viewer at the other side of the support. Alternatively, the light output could be viewed from above the panel and the display element anodes in this case would comprise parts of a continuous ITO layer constituting a supply line common to all display elements in the array. The cathodes of the display elements comprise a metal having a low work-function such as calcium or magnesium silver alloy. Examples of suitable organic conjugated polymer materials which can be used are described in WO 96/36959. Examples of other, low molecular weight, organic materials are described in EP-A-0717446, which also describes examples of the construction and operation of an active matrix electroluminescent device and whose disclosure in these respects is incorporated herein by reference.

Each pixel 10 includes a drive device in the form of a TFT 22 which controls the operation of the display element 20 based on an analogue data signal voltage applied to the pixel. The signal voltage for a pixel is supplied via a column conductor 14 which is shared between a respective column of pixels. The column conductor 14 is coupled to the gate of the current-controlling drive transistor 22 through an address TFT 26. The gates for the address TFTs 26 of a row of pixels are coupled together to a common row conductor 12.

Each row of pixels 10 also shares a common voltage supply line 30, usually provided as a continuous electrode common to all pixels, and a respective common current line 32. The display element 20 and the drive device 22 are connected in series between the voltage supply line 30 and the common current line 32, which is at a positive potential with respect to the supply line 30 and acts as a current source for the current flowing through the display element 20. The current flowing through the display element 20 is controlled by the switching device 22 and is a function of the gate voltage on the transistor 22, which is dependent upon a stored control signal determined by the data signal supplied to the column conductor 14.

A row of pixels is selected by the row driver circuit 16 applying a selection pulse to the row conductor 12 which switches on the address TFTs 26 for the respective row of pixels. A voltage level derived from the video information is applied to the column conductor 14 by the driver circuit 18 and is transferred by the address TFT 26 to the gate of the drive transistor 22. During the periods when a row of pixels is not being addressed via the row conductor 12 the address transistor 26 is turned off, but the voltage on the gate of the drive transistor 22 is maintained by a pixel storage capacitor 36 which is connected between the gate of the drive transistor 22 and the common current line 32. The voltage between the gate of the drive transistor 22 and the common current line 32 determines the current passing through the display element 20 of the pixel 10. Thus, the current flowing through the display element is a function of the gate-source voltage of the drive transistor 22 (the source of the transistor 22 being connected to the common current line 32, and the drain of the transistor 22 being connected to the display element 20). This current in turn controls the light output level (grey-scale) of the pixel.

The switching transistor 22 is arranged to operate in saturation, so that the gate-source voltage governs the current flowing through the transistor, irrespective of the drain-source voltage. Consequently, slight variations of the drain voltage do not affect the current flowing through the display element 20. The voltage on the voltage supply line 30 is therefore not critical to the correct operation of the pixels.

Each row of pixels is addressed in turn in this manner in respective row address periods so as to load the pixels of each row in sequence with their drive signals and set the pixels to provide desired display outputs for the drive (field) period until they are next addressed.

With this known pixel circuit, it will be appreciated that the voltage stored on the capacitor 36 is substantially determined by the applied data signal voltage and that as this voltage in turn controls the drive transistor 22 and the current through the display element 20, then the resulting light output level of the display element at any time will be dependent on the then existing current/light output level characteristic of the display element. The electroluminescent material of the display element can suffer degradation over a period of time of operation leading to ageing effects which result in a reduction of the light output level for a given drive current level. Those pixels which have, therefore, been driven longer (or harder) will exhibit a reduced brightness and cause display non-uniformities. With polymer LED materials the effects of such ageing can be significant.

In the present invention, the drive signal stored in a pixel during the addressing phase is automatically adjusted through electro-optical means in the pixel, acting as a feedback arrangement, according to the light emission characteristic of the display element so as to compensate at least to some extent for such ageing effects and ensure that the required light output level of the display element is produced following addressing.

Figure 3:
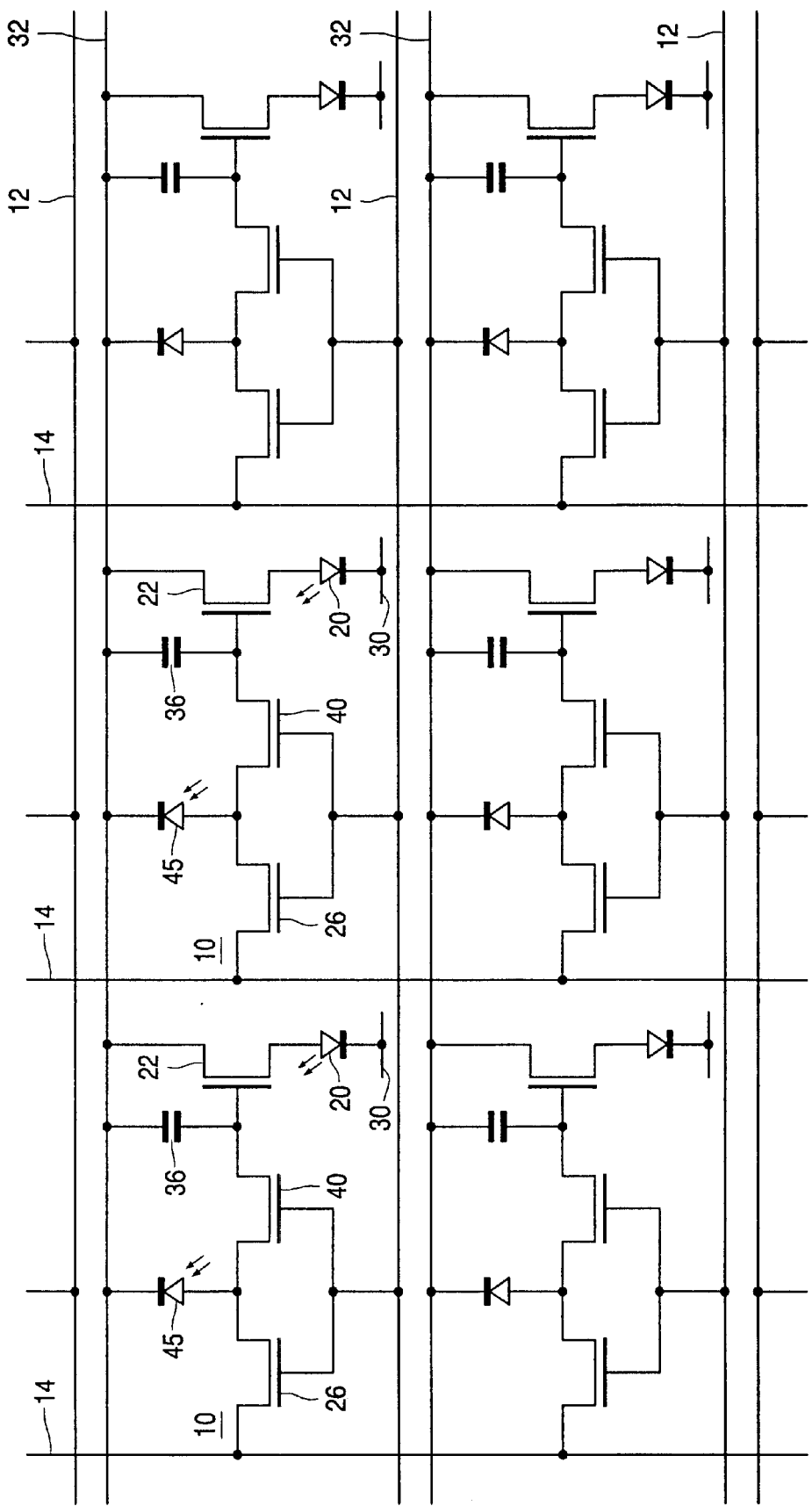
FIG. 3 shows the equivalent circuit of a few typical pixels in an embodiment of an active matrix electroluminescent display device according to the invention.

Referring to FIG. 3, there is shown the equivalent circuit of a pixel in an embodiment of display device according to the invention and intended to overcome, at least to some extent, the problem of ageing. In each pixel 10 the display element 20 is again connected in series with the drive transistor 22 between the current line 32 and a voltage supply line 30, here shown constituted by a common electrode layer shared by all the pixels, and the gate and source of address transistor 26 are connected to the associated row and column conductors 12 and 14 respectively. Also the storage capacitor 36 is again connected between the gate of the drive transistor 22 and the current line 32.

The pixel further includes an additional switch device 40, again in the form of a TFT, which is connected between the address TFT 26 and the node between the storage capacitor 36 and the gate of the drive transistor 22 with its gate terminal connected to the same row conductor 12 as the gate of the address TFT 26 so as to be operated simultaneously with that TFT by the application of a (gating) pulse selection signal applied to the row conductor 12.

A photodiode 45 is connected between the current line 32 associated with the pixel and the node between the TFTs 26 and 40. The pixel is constructed in such a way that the photodiode 45 is exposed to light emitted by the display element 20 of the pixel. The purpose of such optical coupling between these components will become apparent from the following description of the operation of this pixel.

In this device, the data signals applied to the pixels via the column conductors 14 comprise analogue current signals rather than voltage signals. Active matrix electroluminescent devices using current rather than voltage data signals are known, an example of such being described in WO99/65012 (PHB 34253).

As with the known pixel circuit, this pixel circuit has two states, an addressing state in which the pixel is set to the desired display output condition and a driving state in which the display element is thereafter driven according to the set condition until the pixel is again addressed in the subsequent field. In the addressing state, the row driver circuit 16 applies a selection pulse signal to the row conductor 12 in a respective row address period which turns on the TFTs 26 and 40. The capacitor 36 is assumed here for example to be fully discharged at this time. In the addressing phase, a current is sunk in the associated column conductor 14 according to the applied data signal. The charge path is from the current line 32 through the storage capacitor 36 and the photodiode 45 in parallel. As the photodiode is reversed biased it has a high impedance in this initial period. Consequently, the storage capacitor 36 starts to charge through the TFTs 26 and 40 and the voltage between the source and gate of the drive TFT 22 increases. When the threshold level of the TFT 22 is reached the TFT 22 begins to conduct resulting in a current flow through the display element 20 and generation of light thereby to produce a display output. Some of the light emitted by the conducting display element 20 falls upon the photodiode 45, as a result the appropriate physical arrangement of these two components with respect to each other, which causes the photodiode 45 to start to conduct a photocurrent. The extent of photocurrent is proportional to the light level (quantity of photons/second) received thereby even though it is reverse biased. The photodiode 45 then shunts current from the capacitor 36. After a short time, still within the row address period, an equilibrium state is achieved in which the current being sunk by the column conductor 14 is all shunted by the photodiode alone and the gate voltage of the drive TFT 22 stabilises. Thus, the light from the display element 20 is used as a feedback variable, via the photodiode 45, in the setting of the pixel during addressing.

The pixel circuit is then switched to its drive state by the turning off of the TFTs 26 and 40, upon termination of the row selection pulse, to isolate electrically the node between the gate of the TFT 22 and the storage capacitor 36 from the photodiode 45 and column conductor 14. The capacitor 36 now acts to store the gate-source voltage of the TFT 22 as an adjusted drive signal level determining the current drive level of the display element in the drive (display) phase until the pixel is next addressed. This results in a steady current flowing through the display element 20 throughout this drive period. As light from the display element is used as a feedback variable in the setting of the pixel, the light output (photons) per second during the drive phase is fixed according to a desired output light level, and is proportional to the input current.

By using the light output from the display element in this manner during addressing, the setting of the pixel is made dependent on the instantaneous light output generating characteristic of the associated display element and the drive signal voltage stored on the capacitor 36, and the consequential level of current through the display element determined by the TFT 22, is automatically adjusted accordingly so as to compensate for the effects of ageing in the display element. If the light output level for a given drive current in a display element is reduced due to ageing, then the adjusted stored drive signal will cause the display element to be driven at a appropriately higher current level to maintain the desired display effect.

If the capacitor is charged at the start of the addressing phase rather than being fully discharged, and the addressing current (data signal) is zero, the photocurrent in the photodiode 45 will discharge the capacitor 36 until there is no light output from the display element 20 during this phase, and no light would be emitted in the driving phase.

Besides compensating for such effects, the pixel circuit is also effective to compensate automatically for variations in the operational characteristics of the TFTs 22 of different pixels in the array resulting, for example, from variations in their threshold voltages, dimensions, and mobilities due to the nature of the thin film fabrication processes used to form the TFTs. As a result, further improvement in the uniformity of light output from the display elements over the array is achieved.

The TFTs used in the above embodiment of pixel circuit all comprise p-channel MOS TFTs. However, n-channel MOS TFTS could be used instead, with the polarity of the display element 20 and photodiode 45, and the applied drive voltages being reversed. Preferably, polysilicon TFTs are used, although alternatively amorphous silicon TFTs could be employed.

The photodiode 45 may be replaced by a phototransistor (diode-connected) or possibly a photoresistor or other suitable photo-electric device.

Although the photodiode 45 is arranged so that it is exposed to light emitted by the display element 20, it is preferably shielded from ambient light falling on the device so that it is responsive in operation solely to light from the display element.

While the current lines in the above embodiment extend in the row direction and are shared by respective rows of pixels, they may instead extend in the column direction with each current line then being shared by a respective column of pixels.

In summary, therefore, there has been disclosed an active matrix electroluminescent display device which comprises an array of display pixels which each include a current-driven electroluminescent display element connected to a driving device controlling the current flowing through the display element in a drive period according to a voltage stored on a capacitance and determined by a data signal applied in a preceding address period. In order to compensate for ageing effects in the display element, electro-optic means are included in the pixel for adjusting the voltage stored on the capacitance in dependence on the light output of its display element during the address period.

From reading the present disclosure, other modifications will be apparent to persons skilled in the art. Such modifications may involve other features which are already known in the field of active matrix electroluminescent displas devices and component parts thereof and which may be used instead of or in addition to features already described herein.

What is claimed is:

1. An active matrix electroluminescent display device comprising an array of display pixels with each pixel comprising an electroluminescent display element and a driving device for controlling the current through the display element based on a drive signal applied to the pixel during an address period and stored as a voltage on a storage capacitance connected to the driving device, characterised in that each pixel includes electro-optic adjustment means which is responsive to light produced by the display element during an address period and arranged to adjust in the address period the voltage signal stored on the capacitance in the address period in accordance with the light output level of the display element.

2. An active matrix electroluminescent display device according to claim 1, characterised in that the electrooptic adjustment means regulates a current flowing in the pixel during the address period according to an applied data signal, upon which current the voltage stored on the storage capacitance following the address period is dependent.

3. An active matrix electroluminescent display device according to claim 1, characterised in that the electro-optic means comprises an electro-optic device arranged to shunt an electrical current flowing through the storage capacitance during the addressing period according to the display element light output.

4. An active matrix electroluminescent display device according to claim 3, characterised in that the electro-optic device is connected to the storage capacitance via a switch device which is operated during a pixel address period so as to connect the electro-optic device in parallel with the storage capacitance.

5. An active matrix electroluminescent display device according to claim 3, characterised in that the electro-optic device comprises a photodiode.

6. An active matrix electroluminescent display device according to claim 1, characterised in that the driving device comprises a thin film transistor.

7. The active matrix electroluminescent display device according to claim 1 wherein the array of pixels is connected to a plurality of respective row lines and to a plurality of respective column lines, said active matrix electroluminescent display device further comprising;
a row address circuit coupled to said row lines, and
a column data driver circuit coupled to said column lines.

8. An active matrix electroluminescent display device according to claim 2, characterised in that the electro-optic means comprises an electro-optic device arranged to shunt an electrical current flowing through the storage capacitance during the addressing period according to the display element light output.

9. The active matrix electroluminescent display device according to claim 1 wherein the drive device for each pixel comprises a drive transistor coupled to its associated pixel display element, and
the electro-optic adjustment means for each pixel comprises an electro-optic device, and each pixel further comprises;
an address transistor coupled to the electro-optic device and to a control electrode of the drive transistor, and
a further switch transistor coupled to the storage capacitance and to the electro-optic device.

10. The active matrix electroluminescent display device according to claim 9 wherein the address transistor and the further switch transistor are coupled in series between a column data line and the control electrode of the drive transistor,
the electro-optic device is coupled to a circuit point between the address transistor and the further switch transistor,
control electrodes of the address transistor and the further switch transistor are coupled to a row address line, and
the storage capacitance is coupled to a circuit point between the further switch transistor and the control electrode of the drive transistor.

11. An active matrix electroluminescent display device comprising:
an array of display pixels with each pixel comprising an electroluminescent display element and an associated driving device for controlling current through the associated display element based on a drive signal applied to the pixel from a data drive circuit during an address period and stored as a voltage on an associated storage capacitance connected to the associated driving device, wherein
each pixel includes an electro-optic device which is responsive to light produced by the display element during an address period and the electro-optic device adjusts, in the address period, a voltage stored on the storage capacitance in accordance with the light output level of the associated display element.

12. The active matrix electroluminescent display device according to claim 11 wherein the electro-optic device controls a current flowing in the pixel display element during the address period according to an applied data signal so that the voltage stored on the storage capacitance following the address period is dependent on said current.

13. The active matrix electroluminescent display device according to claim 11 wherein the electro-optic device is connected to the storage capacitance via a switch device which is operated during a pixel address period so as to connect the electro-optic device in parallel with the storage capacitance.

14. The active matrix electroluminescent display device according to claim 13 wherein each pixel further comprises;

an address transistor coupled to a control electrode of the driving device via the switch device, and said address transistor and said switch device are operated simultaneously from a row address circuit.

15. The active matrix electroluminescent display device according to claim 11 wherein the data drive circuit applies a data current signal to the pixel during the address period.

16. The active matrix electroluminescent display device according to claim 11 wherein each pixel driving device comprises a switch transistor arranged to operate in saturation.

17. The active matrix electroluminescent display device according to claim 13 wherein the pixel switch device is turned off during a drive period of the pixel thereby to effectively electrically isolate the electro-optic device from the storage capacitance.

18. The active matrix electroluminescent display device according to claim 1, wherein each pixel driving device comprises a respective transistor coupled to the storage capacitance and to its associated electroluminescent display element and electrically controlled at its control electrode by the voltage stored on its respective storage capacitance.

19. The active matrix electroluminescent display device according to claim 1, wherein each pixel further comprises;

an address transistor coupled to a control electrode of the driving device via a switch device, and said address transistor and said switch device are operated in synchronism from a row address circuit.

20. The active matrix electroluminescent display device according to claim 1, wherein the driving device of each pixel comprises a drive transistor and each pixel also comprises an address transistor controlled by a row address circuit, and the drive transistor is controlled by the stored voltage on the storage capacitance, which stored voltage is determined by a data signal from a column data driver circuit.

* * * * *